(12) United States Patent
Mourrier et al.

(10) Patent No.: US 9,906,214 B2
(45) Date of Patent: Feb. 27, 2018

(54) FAULT AND SHORT-CIRCUIT PROTECTED OUTPUT DRIVER

(71) Applicant: Infineon Technologies Americas Corp., El Segundo, CA (US)

(72) Inventors: Andre Mourrier, Manosque (FR); Vincent Thiery, La Roque d'Antheron (FR); Vincent Laville, Marseilles (FR); Loic Bourguine, Aix en Provence (FR)

(73) Assignee: INFINEON TECHNOLOGIES AMERICAS CORP., El Segundo, CA (US)

(*) Notice: Subject to any disclaimer, the term of this patent is extended or adjusted under 35 U.S.C. 154(b) by 171 days.

(21) Appl. No.: 14/845,638

(22) Filed: Sep. 4, 2015

(65) Prior Publication Data

US 2016/0087422 A1    Mar. 24, 2016

Related U.S. Application Data

(60) Provisional application No. 62/053,612, filed on Sep. 22, 2014.

(51) Int. Cl.
| | |
|---|---|
| *H02H 3/00* | (2006.01) |
| *H03K 17/082* | (2006.01) |
| *H02H 7/08* | (2006.01) |
| *H02H 7/122* | (2006.01) |
| *H02H 3/08* | (2006.01) |
| *H02H 3/20* | (2006.01) |
| *H02M 7/5387* | (2007.01) |
| *H03K 17/284* | (2006.01) |

(52) U.S. Cl.
CPC ........ *H03K 17/082* (2013.01); *H02H 7/0844* (2013.01); *H02H 7/122* (2013.01); *H02H 3/08* (2013.01); *H02H 3/202* (2013.01); *H02M 7/5387* (2013.01); *H03K 17/284* (2013.01)

(58) Field of Classification Search
USPC ..................................... 361/86–87
See application file for complete search history.

(56) References Cited

U.S. PATENT DOCUMENTS

| | | | |
|---|---|---|---|
| 8,841,940 B2 | 9/2014 | Barrenscheen et al. | |
| 2002/0093366 A1 | 7/2002 | Fotouhi | |
| 2007/0018656 A1* | 1/2007 | Yasue | H03K 17/18 324/509 |
| 2008/0048877 A1* | 2/2008 | Takahashi | H03K 17/0822 340/653 |

(Continued)

*Primary Examiner* — Danny Nguyen
(74) *Attorney, Agent, or Firm* — Slater Matsil, LLP

(57) ABSTRACT

A driver and protection circuit for driving a power switch is disclosed. The driver and protection circuit includes a fault detection block configured to detect a discrepancy between a reference drive signal and a measured voltage at a gate of the power switch. The driver and protection circuit also includes a short circuit detection block configured to detect a gate-to-source short circuit or a gate-to-drain short circuit of the power switch. The driver and protection circuit further includes a latch coupled to the fault detection block and the short circuit detection block to selectively turn off an output driver coupled to the gate of the power switch when a fault or a short circuit is detected, and wherein the latch is configured to send a diagnostic signal when the fault or the short circuit is detected.

19 Claims, 4 Drawing Sheets

(56) References Cited

U.S. PATENT DOCUMENTS

2011/0002073 A1* 1/2011 Fukuda .................. H03F 1/523
361/87
2014/0362478 A1* 12/2014 Kuo ..................... H02H 11/005
361/18

* cited by examiner

FAULT AND SHORT-CIRCUIT PROTECTED OUTPUT DRIVER

The present application claims the benefit of and priority to a provisional patent application entitled "Fully Protected Output Discrete Driver," Ser. No. 62/053,612 filed on Sep. 22, 2014. The disclosure in this provisional application is hereby incorporated fully by reference into the present application.

BACKGROUND

Half-bridge circuits have been used as power switching output stages in various applications such as motor drives, electronic ballasts for fluorescent lamps and power supplies. The half-bridge circuits employ a pair of connected switching elements (e.g., field-effect transistors (FETs) or insulated-gate bipolar transistors (IGBTs)) that are placed across, for example, a DC high voltage power supply. The switching elements are driven by a driver integrated circuit (IC) to ensure proper operations of the switching elements.

In conventional techniques, when a switching element has a failure (e.g., a gate is shorted to a source or a drain), the driver IC cannot readily identify that switching element. As such, all drivers in the driver IC and their corresponding switching elements need to be stopped before the operations can be resumed, which can lead to significant time and power losses. Thus, there is a need in the art for a driver IC that can protect an individual driver when a failure occurs, while other drivers and switching elements continue operation.

SUMMARY

The present disclosure is directed to a fault and short-circuit protected output driver, substantially as shown in and/or described in connection with at least one of the figures, and as set forth in the claims.

DETAILED DESCRIPTION

Figure 1:
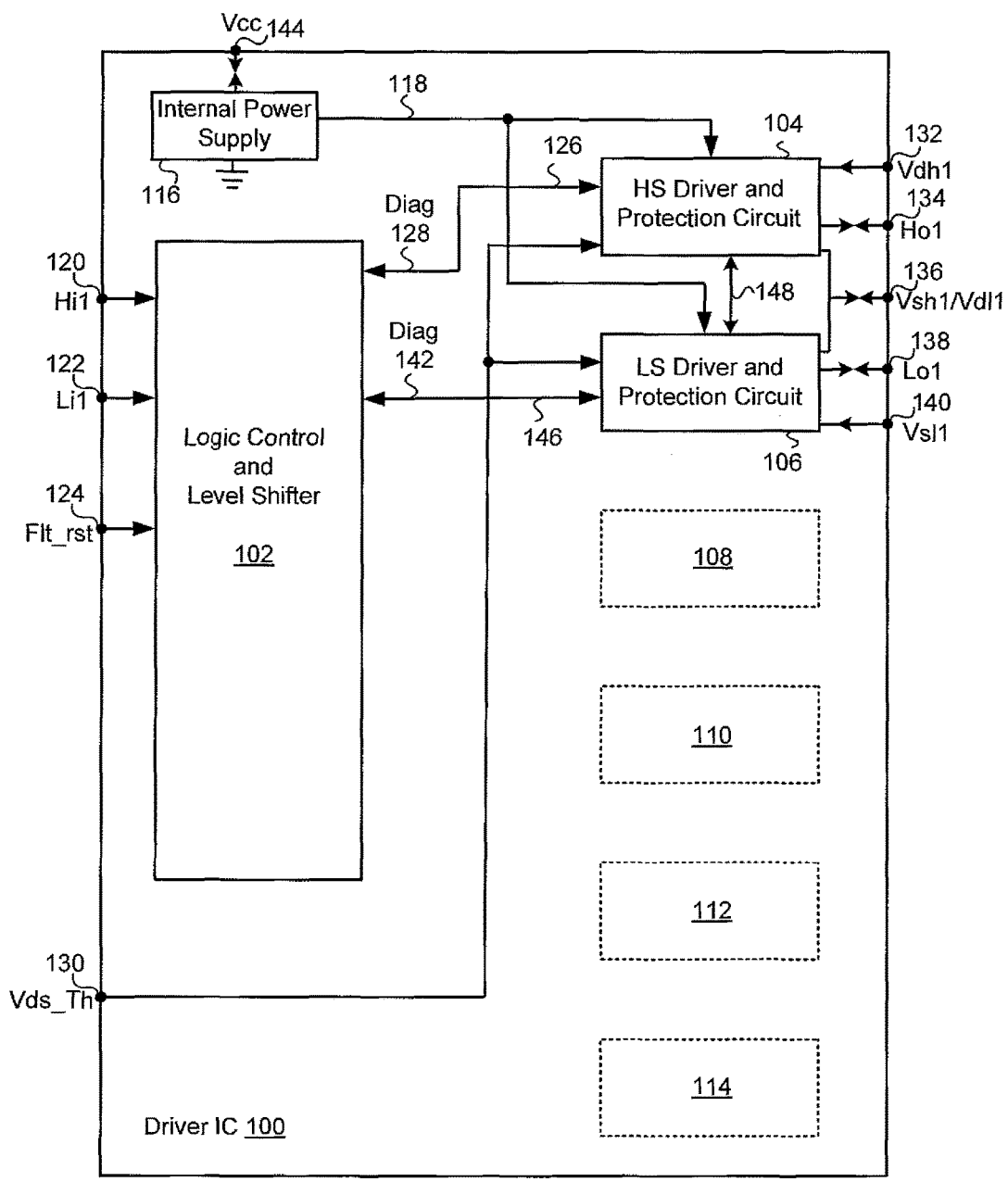
FIG. 1 illustrates a schematic diagram of an exemplary driver integrated circuit (IC), according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a schematic diagram of an exemplary driver integrated circuit, according to one implementation of the present application. As illustrated in FIG. 1, driver IC 100 includes logic control and level shifter 102, high side driver and protection circuits 104, 108 and 112, and low side driver and protection circuits 106, 110 and 114, and internal power supply 116 coupled to external supply voltage 144. FIG. 1 also shows driver IC 100 as having terminals, Hi1, Li1, Flt_rst, Vds_Th, Vdh1, Ho1, Vsh1/Vdl1, Lo1, Vsl1 and $V_{CC}$.

As illustrated in FIG. 1, logic control and level shifter 102 is configured to receive high side gate drive input signal 120 at Hi1 terminal, low side gate drive input signal 122 at Li1 terminal, and fault reset input signal 124 at Flt_rst terminal. Logic control and level shifter 102 is configured to provide reference drive signal 126 to high side driver and protection circuit 104 responsive to high side gate drive input signal 120. Logic control and level shifter 102 is also configured to provide reference drive signal 146 to low side driver and protection circuit 106 responsive to low side gate drive input signal 122. Logic control and level shifter 102 is further configured to relay fault reset input signal 124 from Flt_rst terminal to high side driver and protection circuit 104 and/or low side driver and protection circuit 106. Logic control and level shifter 102 may be powered by internal power supply 116 or an external power supply (not explicitly shown in FIG. 1).

High side driver and protection circuit 104 is configured to receive reference drive signal 126 from logic control and level shifter 102, and provide signal 134 to a gate of a high side power switch (not explicitly shown in FIG. 1) which is coupled to driver IC 100 at Ho1 terminal. High side driver and protection circuit 104 is configured to provide diagnostic signal 128 to logic control and level shifter 102 when a fault and/or a short circuit is detected based on signals 132, 134 and 136 received from Vdh1 terminal, Ho1 terminal, and Vsh1/Vdl1 terminal, respectively.

As discussed in detail with reference to FIG. 2 below, high side driver and protection circuit 104 is configured to detect a discrepancy between reference drive signal 126 and a measured voltage (e.g., signal 134) at a gate of a high side power switch, and turn off an output driver (not explicitly shown in FIG. 1) coupled to the gate of the high side power switch when a fault is detected. High side driver and protection circuit 104 is also configured to detect a gate-to-source short circuit and/or a gate-to-drain short circuit of the high side power switch, and turn off the output driver coupled to the gate of the high side power switch when a short circuit is detected. High side driver and protection circuit 104 is further configured to receive drain-to-source threshold voltage 130 from Vds_Th terminal to protect the high side power switch when a drain-to-source voltage of the high side power switch is greater than drain-to-source threshold voltage 130 or a fraction thereof. High side driver and protection circuit 104 is also configured to receive fault reset input signal 124 from Flt_rst terminal to reset a latch (not explicitly shown in FIG. 1) in high side driver and protection circuit 104.

Similarly, low side driver and protection circuit 106 is configured to receive reference drive signal 146 from logic control and level shifter 102, and provide signal 138 to a gate of a low side power switch (not explicitly shown in FIG. 1) which is coupled to driver IC 100 at Lo1 terminal. Low side driver and protection circuit 106 is configured to provide diagnostic signal 142 to logic control and level shifter 102 when a fault and/or a short circuit is detected based on signals 136, 138 and 140 received from Vsh1/Vdl1 terminal, Lo1 terminal, and Vsl1 terminal, respectively. Similar to the operations of high side driver and protection circuit 104, low side driver and protection circuit 106 is configured to detect a discrepancy between reference drive signal 146 and a measured voltage (e.g., signal 138) at the gate of the low side power switch, and turn off an output driver (not explicitly shown in FIG. 1) coupled to the gate of the low side power switch when a fault is detected. Low side driver and protection circuit 106 is also configured to detect a gate-to-source short circuit and/or a gate-to-drain short circuit of the low side power switch, and turn off the output driver coupled to the gate of the low side power switch when a short circuit is detected. Low side driver and protection circuit 106 is further configured to receive drain-to-source threshold voltage 130 from Vds_Th terminal to protect the low side power switch when a drain-to-source voltage of the low side power switch is greater than drain-to-source threshold voltage 130 or a fraction thereof. Low side driver and protection circuit 106 is also configured to receive fault reset input signal 124 from Flt_rst terminal to reset a latch (not explicitly shown in FIG. 1) in low side driver and protection circuit 106.

As illustrated in FIG. 1, internal power supply 116 provides supply voltage 118 to high side driver and protection circuit 104 and low side driver and protection circuit 106. In one implementation, internal power supply 116 may also provide a supply voltage to logic control and level shifter 102. High side driver and protection circuit 104 and low side driver and protection circuit 106 may exchange dead time signals 148 with each other. As illustrated in FIG. 1, driver IC 100 may also optionally include high side driver and protection circuits 108 and 112, and low side driver and protection circuits 110 and 114 coupled to logic control and level shifter 102 and internal power supply 116, and configured to provide control signals to respective high side and low side power switches (not explicitly shown in FIG. 1). Each of high side driver and protection circuits 104, 108 and 112, and low side driver and protection circuits 106, 110 and 114 is configured to drive a power switch, and includes a latch (not explicitly shown in FIG. 1) which can shut down their respective power switch independent from the operations of the other power switches, when a fault or a short circuit is detected.

In one implementation, driver IC 100 may be a three-phase brushless DC motor controller. In one implementation, driver IC 100 may be part of a quad flat no-lead (QFN) package, where logic control and level shifter 102, high side driver and protection circuits 104, 108 and 112, low side driver and protection circuits 106, 110 and 114, and internal power supply 116 are monolithically integrated on a semiconductor die. Driver IC 100 may also optionally include additional circuitry, such as a charge pump circuit, an under voltage circuit, an over temperature protection circuit, a shoot through protection circuit, a dead time control circuit, a current feedback circuit, and corresponding terminals (the above-mentioned circuits and terminals are not explicitly shown in FIG. 1).

Figure 2:
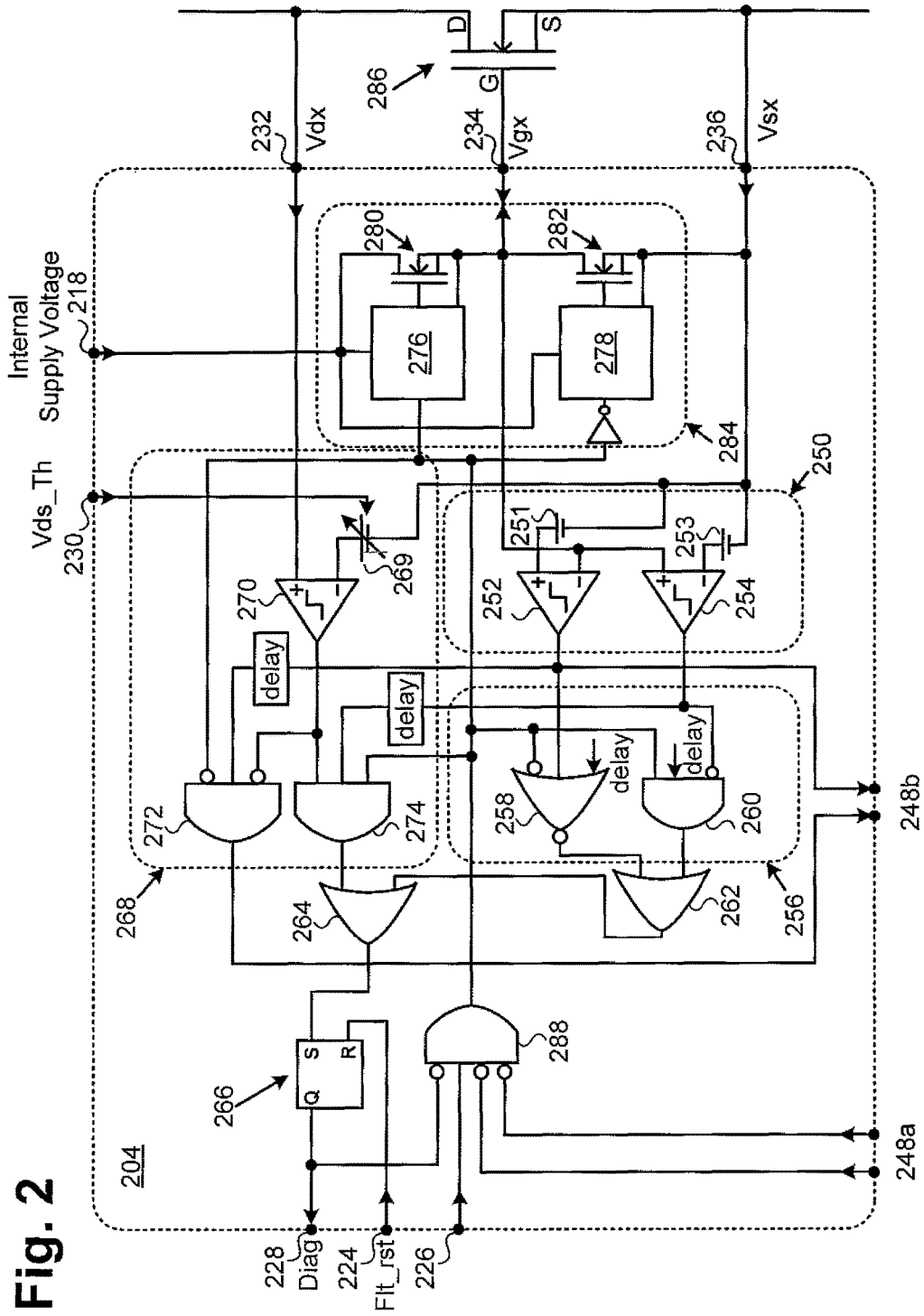
FIG. 2 illustrates a schematic diagram of an exemplary driver and protection circuit of a driver IC, according to one implementation of the present application.

Turning to FIG. 2, FIG. 2 illustrates a schematic diagram of an exemplary driver and protection circuit of a driver IC, according to one implementation of the present application. As illustrated in FIG. 2, driver and protection circuit 204 may correspond to high side driver and protection circuit 104 or low side driver and protection circuit 106 in FIG. 1. With similar numerals representing similar features in FIG. 1, driver and protection circuit 204 is configured to receive reset signal 224, reference drive signal 226, drain-to-source threshold voltage 230, internal supply voltage 218, drain voltage 232 of power switch 286, measured voltage 234 at the gate of power switch 286, source voltage 236 of power switch 286, and dead time signals 248a from a low side driver and protection circuit (not explicitly shown in FIG. 2), such as low side driver and protection circuit 106 in FIG. 1. Driver and protection circuit 204 is configured to provide a control signal the gate of power switch 286, diagnostic signal 228 to a microprocessor (not explicitly shown in FIG. 2) through logic control and level shifter 102 in FIG. 1, and dead time signals 248b to a low side driver and protection circuit (not explicitly shown in FIG. 2), such as low side driver and protection circuit 106 in FIG. 1.

As illustrated in FIG. 2, in the present implantation, driver and protection circuit 204 includes fault detection block 250, short circuit detection block 256, drain-to-source saturation protection block 268, OR gate 262, OR gate 264, latch 266, AND gate 288, and output driver 284. Fault detection block 250 is configured to detect a discrepancy between reference drive signal 226 and measured voltage 234 at the gate of power switch 286. Short circuit detection block 256 is configured to detect a gate-to-source short circuit and/or a gate-to-drain short circuit of power switch 286. Drain-to-source saturation protection block 268 is configured to detect a saturation condition when a drain-to-source voltage of power switch 286 is greater than drain-to-source threshold voltage 130 or a fraction thereof. Latch 266 is coupled to the outputs of fault detection block 250, short circuit detection block 256 and drain-to-source saturation protection block 268 to selectively turn off output driver 284 coupled to the gate of power switch 286, when a fault, a short circuit and/or a saturation conduction is detected. Latch 266 is coupled to fault reset input signal (Flt_rst) terminal to receive reset signal 224 for resetting latch 266.

In the present implementation, fault detection block 250 includes gate monitoring low threshold voltage ($V_{th\_gate\_Mtrg\_lo}$) 251, comparator 252, gate monitoring high threshold voltage ($V_{th\_gate\_Mtrg\_hi}$) 253 and comparator 254. As illustrated in FIG. 2, measured voltage 234 at the gate of power switch 286 is provided to the negative input of comparator 252. $V_{th\_gate\_Mtrg\_lo}$ 251, which is coupled to the source of power switch 286, is provided to the positive input of comparator 252. In the present implementation, $V_{th\_gate\_Mtrg\_lo}$ 251 may have a range between 0.7 volts and 1.9 volts, such as 1.2 volts. In other implementations, $V_{th\_gate\_Mtrg\_lo}$ 251 may be less than 0.7 volts or greater than 1.9 volts. As illustrated in FIG. 2, measured voltage 234 at the gate of power switch 286 is also provided to the positive input of comparator 254, and $V_{th\_gate\_Mtrg\_hi}$ 253 that is coupled to the source of power switch 286 is provided to the negative input of comparator 254. In the present implementation, $V_{th\_gate\_Mtrg\_hi}$ 253 may have a range between 6.5 volts and 8.6 volts, such as 7.3 volts. In other implementations, $V_{th\_gate\_Mtrg\_hi}$ 253 may be less than 6.5 volts or greater than 8.6 volts.

Fault detection block 250 is configured to check whether measured voltage 234 at the gate of power switch 286 is consistent with an order (i.e., reference drive signal 226) sent, for example, from logic control and level shifter 102 in FIG. 1. For example, when reference drive signal 226 is a turn-on order, if measured voltage 234 at the gate of power switch 286 is less than $V_{th\_gate\_Mtrg\_hi}$ 253 (e.g., 7.3 volts), comparator 254 outputs a LOW signal to AND gate 260. The LOW signal is inverted to a HIGH signal at an input of AND gate 260 after a small delay (e.g., 1.3 μs). AND gate 260 receives another HIGH signal from AND gate 288 since reference drive signal 226 is a turn-on order, and outputs a HIGH signal to OR gate 262. OR gate 262 in turn outputs a HIGH signal which is relayed through OR gate 264 to latch 266 to set the latch. As latch 266 is set, diagnostic signal 228 is sent to a microprocessor to report a fault of driver and protection circuit 204. Also, as latch 266 is set, the output of latch 266 is provided to AND gate 288. Upon receiving the inverted output of latch 266 at its input, AND gate 288 outputs a LOW signal, thereby turning off output driver 284.

Fault detection block 250 is also configured to check whether the gate of power switch 286 is properly turned off when reference drive signal 226 is a turn-off order. For example, when reference drive signal 226 is a turn-off order, if measured voltage 234 at the gate of power switch 286 is greater than $V_{th\_gate\_Mtrg\_lo}$ 251 (e.g., 1.2 volts), comparator 252 outputs a LOW signal to NOR gate 258. NOR gate 258 receives the LOW signal from comparator 252 after a small delay (e.g., 1.3 μs). NOR gate 258 also receives an inverted output from AND gate 288. In a case where the gate of power switch 286 is not properly turned off, the input from AND gate 288 may be at a logic HIGH. The HIGH output signal from AND gate 288 is inverted at the input of NOR gate 258. As both inputs of NOR gate 258 are LOW signals, NOR gate 258 generates a HIGH signal at its output, and provides the HIGH signal to OR gate 262. OR gate 262 in turn outputs a HIGH signal which is relayed through OR gate 264 to latch 266 to set the latch. As latch 266 is set, diagnostic signal 228 is sent to the microprocessor to report a fault of driver and protection circuit 204. Also, as latch 266 is set, the output of latch 266 is provided to AND gate 288. Upon receiving the inverted output of latch 266 at its input, AND gate 288 outputs a LOW signal, thereby turning off output driver 284.

In the present implementation, short circuit detection block 256 includes NOR gate 258 and AND gate 260. Short circuit detection block 256 is configured to detect and protect against a gate-to-source short circuit of power switch 286. For example, when reference drive signal 226 is a turn-on order and power switch 286 is turned on, if a gate-to-source short circuit occurs (e.g., measured voltage 234 at the gate of power switch 286 is substantially equal to source voltage 236), comparator 254 outputs a LOW signal to AND gate 260. The LOW signal from comparator 254 is inverted to a HIGH signal at an input of AND gate 260 after a small delay (e.g., 1.3 μs). AND gate 260 also receives another HIGH signal from AND gate 288 since reference drive signal 226 is a turn-on order. AND gate 260 then outputs a HIGH signal to OR gate 262. OR gate 262 in turn outputs a HIGH signal which is relayed through OR gate 264 to latch 266 to set the latch. As latch 266 is set, diagnostic signal 228 is sent to the microprocessor to report a short circuit of power switch 286. Also, as latch 266 is set, the output of latch 266 is provided to AND gate 288. Upon receiving the inverted output of latch 266 at its input, AND gate 288 outputs a LOW signal, thereby turning off output driver 284.

Short circuit protection detection 256 is also configured to detect and protect against a gate-to-drain short circuit of power switch 286. For example, when reference drive signal 226 is a turn-on order and power switch 286 is turned on, if a gate-to-drain short circuit occurs (e.g., measured voltage 234 at the gate of power switch 286 is substantially equal to drain voltage 232), power switch 286 is in saturation mode. Comparator 252 outputs a LOW signal to NOR gate 258. NOR gate 258 receives the LOW signal from comparator 252 after a small delay (e.g., 1.3 μs). NOR gate 258 also receives an inverted output of AND gate 288 at its input. Since reference drive signal 226 is a turn-on order, AND gate 288 outputs a HIGH signal to NOR gate 258. The HIGH signal is inverted at the input of NOR gate 258, which in turn outputs a HIGH signal to OR gate 262. OR gate 262 in turn outputs a HIGH signal which is relayed through OR gate 264 to latch 266 to set the latch. As latch 266 is set, diagnostic signal 228 is sent to the microprocessor to report a short circuit of power switch 286. Also, as latch 266 is set, the output of latch 266 is provided to AND gate 288. Upon receiving the inverted output of latch 266 at its input, AND gate 288 outputs a LOW signal, thereby turning off output driver 284.

As illustrated to FIG. 2, driver and protection circuit 204 also includes drain-to-source saturation protection block 268 configured to selectively turn off output driver 284 when the drain-to-source voltage of power switch 286 is greater than drain-to-source threshold voltage 230 or a fraction of drain-to-source threshold voltage 230. In one implementation, when measured voltage 234 at the gate of power switch 286 is greater than $V_{th\_gate\_Mtrg\_hi}$ 253 (e.g., 7.3 volts), fault detection block 250 considers power switch 286 as being fully turned on. Comparator 254 outputs a HIGH signal to AND gate 260 and drain-to-source saturation protection block 268, which monitors the drain-to-source voltage when power switch 286 is fully turned on. Drain-to-source saturation protection block 268 includes comparator 270, AND gate 272 and AND gate 274. Comparator 270 receives programmable drain-to-source detection voltage 269 based on drain-to-source threshold voltage 230. Programmable drain-to-source detection voltage 269 may be equal to or a fraction of drain-to-source threshold voltage 230. In the present implementation, drain-to-source threshold voltage 230 may have a range between 0.3 volts and 3 volts. In other implementations, drain-to-source threshold voltage 230 may be less than 0.3 volts or greater than 3 volts. When drain voltage 232 becomes greater than programmable drain-to-source detection voltage 269 (e.g., one eighth of drain-to-source threshold voltage 230), comparator 270 outputs a HIGH signal to AND gate 274. AND gate 274 also receives a HIGH signal from comparator 254 after a small delay (e.g., 1.3 μs) and another HIGH signal from AND gate 288. AND gate 274 outputs a High signal to OR gate 264, which in turn outputs a HIGH signal to latch 266 to set the latch. As latch 266 is set, diagnostic signal 228 is sent to the microprocessor to report a saturation condition of power switch 286. Also, as latch 266 is set, the output of latch 266 is provided to AND gate 288. Upon receiving the inverted output of latch 266 at its input, AND gate 288 outputs a LOW signal, thereby turning off output driver 284. Thus, among other advantages, one or more diagnostic signals 228 can be provided to the microprocessor, when a fault, a short circuit or a saturation condition occurs. As such, the one or more diagnostic signals 228 can provide enhanced feedback to enable the microprocessor to implement the right safety strategy directly toward one or more faulty power switches.

As illustrated in FIG. 2, AND gate 272 receives an inverted input from AND gate 288, an inverted input from comparator 270 and an input from comparator 252 after a small delay (e.g., 1.3 μs). The outputs of AND gate 272 and comparator 252 are provided as dead time signals 248b to, for example, a low side driver and protection circuit (not explicitly shown in FIG. 2), such as low side driver and protection circuit 106 in FIG. 1. In addition, low side driver and protection circuit 106 in FIG. 1 may provide dead time signals 248a to driver and protection circuit 204.

As illustrated in FIG. 2, output driver 284 includes pre-drivers 276 and 278 for driving switches 280 and 282, respectively. Pre-drivers 276 and 278 receive internal supply voltage 218, for example, from internal power supply 116 in FIG. 1. Pre-driver 276 receives the output of AND gate 288, while pre-driver 278 receives the inverted output of AND gate 288, and provide control signals for driving switches 280 and 282, respectively. Pre-drivers 276 and 278 are configured to drive switches 280 and 282 to provide a current to the gate of power switch 286.

In the present implementation, when reference drive signal 226 is a turn-on order, output driver 284 is configured to turn on switch 280 and turn off switch 282. Switch 280, the gate of which is controlled by pre-driver 276, is turned on for a short duration (e.g., 2 µs) to provide a high current to the gate of power switch 286. After the short duration, pre-driver 276 turns on another switch coupled in parallel with switch 280 (not explicitly shown in FIG. 2) and turns off switch 280, such that output driver 284 provides a low current to the gate of power switch 286, where the low current is sufficient to keep power switch 286 in the on state. Similarly, when reference drive signal 226 is a turn-off order, output driver 284 is configured to turn off switch 280 and turn on switch 282. Switch 282, the gate of which is controlled by pre-driver 278, is turned on for a short duration (e.g., 2 µs) to direct a high current away from the gate of power switch 286. After the short duration, pre-driver 278 turns on another switch coupled in parallel with switch 282 (not explicitly shown in FIG. 2) and turns off switch 282, such that output driver 284 directs a low current away from the gate of power switch 286, where the low current is sufficient to keep power switch 286 in the off state.

Figure 3:
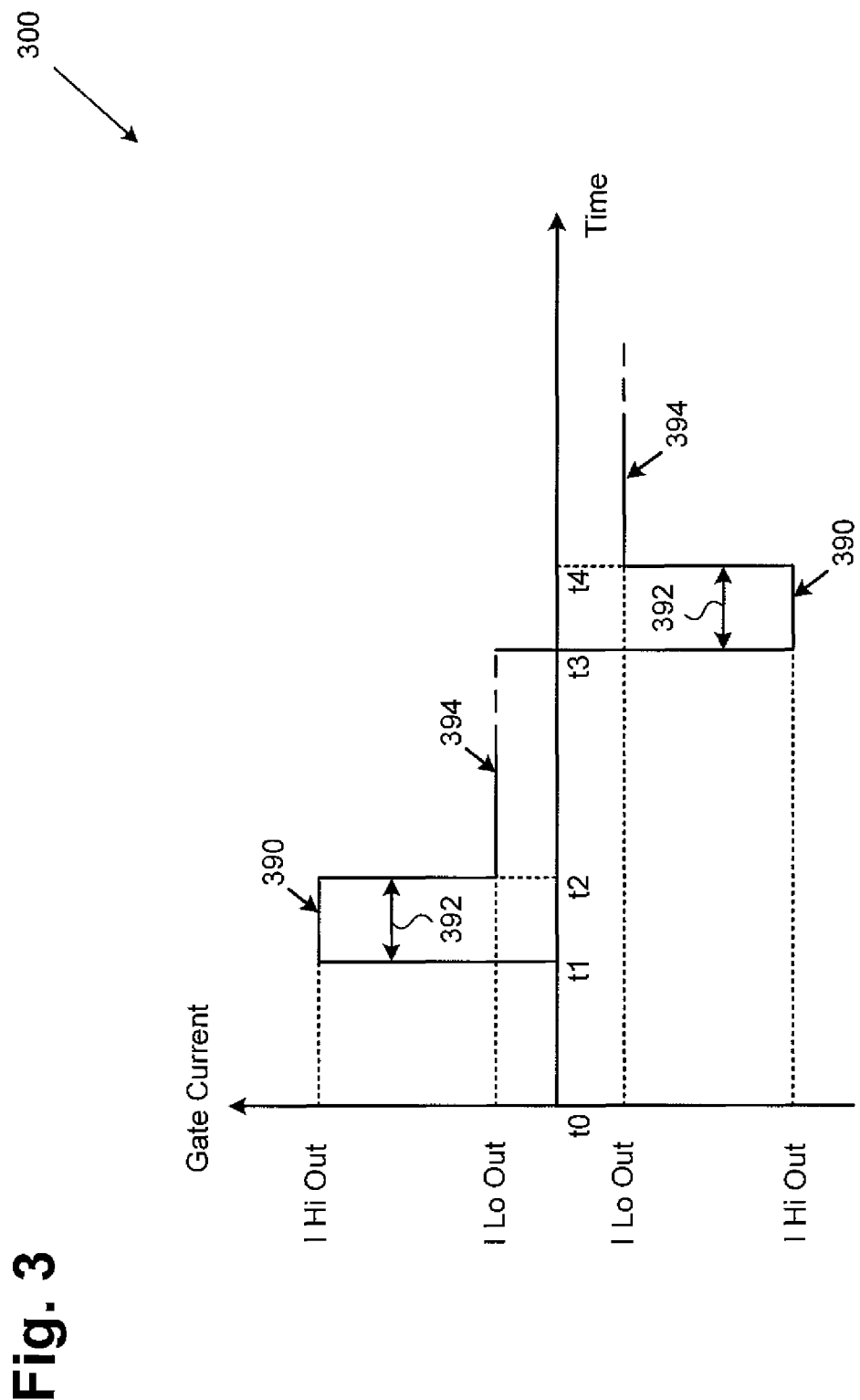
FIG. 3 illustrates an output current profile of an exemplary driver and protection circuit of a driver IC, according to one implementation of the present application.

FIG. 3 illustrates an output current profile of an exemplary driver and protection circuit of a driver IC, according to one implementation of the present application. In the present application, current profile 300 may represent a gate current profile of power switch 286 in FIG. 2. As illustrated in FIG. 3, the output of output driver 284 has two different levels of current, a high current (i.e., I_Hi_Out) and a low current (i.e., I_Lo_Out).

In the present implementation, I_Hi_Out has amplitude 390 (e.g., 2 A), which is sufficient to turn on or off power switch 286 in FIG. 2, and duration 392 (e.g., 2 µs). Thereafter, output driver 284 is configured to provide I_Lo_Out to the gate of power switch 286 to keep power switch 286 in its corresponding on or off state. As illustrated in FIG. 3, I_Lo_Out has amplitude 394 (e.g., 50 mA) between t2 and t3. As can be seen in FIG. 3, the gate current of power switch 286 is pulsed (e.g., with amplitude 390 and duration 392) between t1 and t2 and between t3 and t4 to avoid burning the output stage in case of a short circuit. As such, the duration of the high current during the turn on and the turn off of power switch 286 is limited. In the event of a gate to source short circuit, driver and protection circuit 204 is configured to turn off its output, which can avoid discharging a charge pump of driver and protection circuit 204 thereby maintaining driver and protection circuit 204 operational. Also, because the duration of the high current value during the turn on and turn off is limited, driver and protection circuit 204 is able to sustain a short circuit, for example, between the gate and drain of power switch 286.

Figure 4:
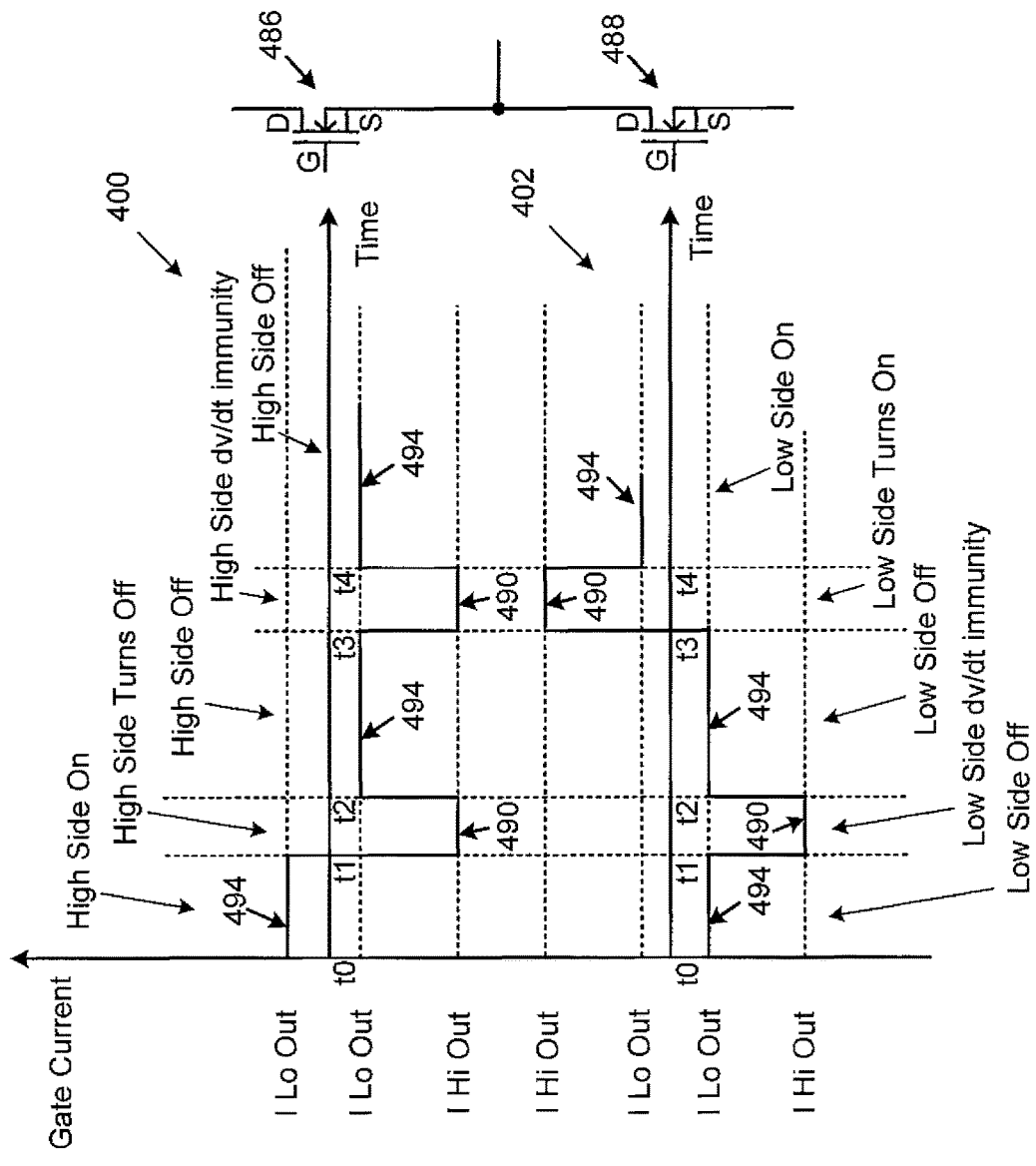
FIG. 4 illustrates output current profiles of a high side driver and protection circuit and a low side driver and protection circuit of a driver IC, according to one implementation of the present application.

FIG. 4 illustrates output current profiles of a high side driver and protection circuit and a low side driver and protection circuit of a driver IC, according to one implementation of the present application. In the present application, current profiles 400 and 402 may represent respective gate current profiles of high side power switch 486 and low side power switch 488, for example, driven by high side driver and protection circuit 104 and low side driver and protection circuit 106 in FIG. 1, respectively. In the present implementation, high side power switch 486 and low side power switch 488 may include metal-oxide-semiconductor field-effect transistors (MOSFETS) or insulated-gate bipolar transistors (IGBTs) that are connected in a half-bridge configuration. In other implementations, high side power switch 486 and low side power switch 488 may include other suitable semiconductor switching elements that may be connected in a half-bridge configuration.

As illustrated in FIG. 4, between t0 and t1, high side power switch 486 is on, and low side power switch 488 is off, where a low current (i.e., I_Lo_Out) with amplitude 494 (e.g., 50 mA) is provided to the gate of high side power switch 486 to keep it on, and I_Lo_Out with amplitude 494 (e.g., 50 mA) is directed away from the gate of low side power switch 488 to keep it off. Between t1 and t2, high side power switch 486 is turned off by a high current (i.e., I_Hi_Out) with amplitude 490 (e.g., 2 A). While high side power switch 486 is turned off, low side driver and protection circuit 106 reactivates I_Hi_Out with amplitude 490 (e.g., 2 A) to direct current away from the gate of low side power switch 488 to increase low side driver and protection circuit 106's dv/dt immunity. As further illustrated in FIG. 4, between t2 and t3, both high side power switch 486 and low side power switch 488 are off. Thus, I_Lo_Out with amplitude 494 (e.g., 50 mA) is directed away from the gates of high side power switch 486 and low side power switch 488. Between t3 and t4, low side power switch 488 is turned on by I_Hi_Out with amplitude 490 (e.g., 2 A). While low side power switch 488 is turned on, high side driver and protection circuit 104 reactivates I_Hi_Out with amplitude 490 (e.g., 2 A) to direct current away from the gate of high side power switch 486 to increase high side driver and protection circuit 104's dv/dt immunity. After t4, low side driver and protection circuit 106 provides I_Lo_Out to low side power switch 488 to keep it on, while high side driver and protection circuit 104 provides I_Lo_Out to high side power switch 486 to keep it off.

Thus, high side driver and, protection circuit 104 and low side driver and protection circuit 106 may reactivate I_Hi_Out during the commutation of the opposite power switch to increase their respective driver and protection circuit's dv/dt immunity. As illustrated in FIG. 4, high side driver and protection circuit 104 and low side driver and protection circuit 106 may provide a sufficient dead time (e.g., between t1 and t3) after high side power switch 486 is turned off and before low side power switch 488 is turned on. Also, because the duration of the high current value during the turn on and turn off is limited, each of high side driver and protection circuit 104 and low side driver and protection circuit 106 is able to sustain a gate-to-source short circuit and/or a gate-to-drain short circuit in their respective switches.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A driver/protection circuit for driving a power switch, said driver/protection circuit comprising:
   a fault detection block configured to detect a discrepancy between a reference drive signal and a measured voltage at a gate of said power switch, wherein said fault detection block is configured to compare said measured voltage at said gate of said power switch with a gate monitoring low threshold voltage or a gate monitoring high threshold voltage;
   a short circuit detection block configured to detect a gate-to-source short circuit or a gate-to-drain short circuit of said power switch; and
   a latch coupled to said fault detection block and said short circuit detection block to selectively turn off an output driver coupled to said gate of said power switch when a fault or a short circuit is detected, wherein said latch is configured to turn off said output driver if said measured voltage at said gate of said power switch is less than or equal to said gate monitoring low threshold voltage when said reference drive signal is a turn-on order.

2. The driver/protection circuit of claim 1, wherein said latch is configured to send a diagnostic signal when said fault or said short circuit is detected.

3. The driver/protection circuit of claim 1, wherein said latch is configured to receive a reset signal to reset said latch.

4. The driver/protection circuit of claim 1, further comprising a drain-to-source saturation protection block configured to selectively turn off said output driver when a voltage between a drain and a source of said power switch is greater than a drain-to-source threshold voltage.

5. The driver/protection circuit of claim 1, wherein said latch is configured to turn off said output driver if said measured voltage at said gate of said power switch is greater than or equal to said gate monitoring high threshold voltage when said reference drive signal is a turn-off order.

6. The driver/protection circuit of claim 1, wherein said fault detection block is coupled to said short circuit detection block.

7. The driver/protection circuit of claim 4, wherein said fault detection block is coupled to said drain-to-source saturation protection block.

8. A driver integrated circuit (IC) comprising:
   a logic control and level shifter; and
   a high side driver/protection circuit coupled to said logic control and level shifter and configured to drive a high side power switch,
   wherein said high side driver/protection circuit comprises:
      a short circuit detection block configured to detect a gate-to-source short circuit or a gate-to-drain short circuit of said high side power switch,
      a fault detection block configured to compare a measured voltage at a gate of said high side power switch with a gate monitoring low threshold voltage or a gate monitoring high threshold voltage, and
      a latch coupled to said short circuit detection block to selectively turn off a high side output driver coupled to a gate of said high side power switch when a short circuit is detected, wherein said latch is configured to turn off said high side output driver if said measured voltage at said gate of said high side power switch is less than or equal to said gate monitoring low threshold voltage when a reference drive signal is a turn-on order.

9. The driver IC of claim 8, wherein said fault detection block is configured to detect a discrepancy between the reference drive signal and the measured voltage at said gate of said high side power switch.

10. The driver IC of claim 9, wherein said latch is coupled to said fault detection block to selectively turn off said high side output driver when a fault is detected.

11. The driver IC of claim 8, further comprising a low side driver/protection circuit coupled to said logic control and level shifter and configured to drive a low side power switch.

12. The driver IC of claim 11, wherein said high side driver/protection circuit and said low side driver/protection circuit are configured to independently turn off said high side output driver and a low side output driver.

13. The driver IC of claim 10, wherein said latch is configured to send a diagnostic signal when said fault or said short circuit is detected.

14. The driver IC of claim 8, further comprising a drain-to-source saturation protection block configured to selectively turn off said high side output driver when a voltage between a drain and a source of said high side power switch is greater than a drain-to-source threshold voltage.

15. The driver IC of claim 8, wherein said latch is configured to turn off said high side output driver if said measured voltage at said gate of said high side power switch is greater than or equal to said gate monitoring high threshold voltage when said reference drive signal is a turn-off order.

16. The driver IC of claim 11, wherein said high side power switch is connected with said low side power switch in a half-bridge configuration.

17. A driver integrated circuit (IC) comprising:
   a logic control and level shifter;
   a high side driver/protection circuit coupled to said logic control and level shifter and configured to drive a high side power switch; and
   a low side driver/protection circuit coupled to said logic control and level shifter and configured to drive a low side power switch,
   wherein said high side driver/protection circuit comprises:
      a short circuit detection block configured to detect a gate-to-source short circuit or a gate-to-drain short circuit of said high side power switch, and
      a latch coupled to said short circuit detection block to selectively turn off a high side output driver coupled to a gate of said high side power switch when a short circuit is detected.

18. The driver IC of claim 17, wherein said high side driver/protection circuit and said low side driver/protection circuit are configured to independently turn off said high side output driver and a low side output driver.

19. The driver IC of claim 17, wherein said high side power switch is connected with said low side power switch in a half-bridge configuration.

* * * * *